United States Patent
Sandhu

(10) Patent No.: US 7,026,642 B2
(45) Date of Patent: Apr. 11, 2006

(54) VERTICAL TUNNELING TRANSISTOR

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/649,058

(22) Filed: Aug. 27, 2003

(65) Prior Publication Data

US 2005/0045871 A1 Mar. 3, 2005

(51) Int. Cl.
*H01L 29/06* (2006.01)

(52) U.S. Cl. .............................. 257/25; 257/20; 257/22; 257/24

(58) Field of Classification Search .................. 257/25, 257/20, 22, 24
See application file for complete search history.

(56) References Cited

U.S. PATENT DOCUMENTS

| | | | |
|---|---|---|---|
| 4,396,999 A | 8/1983 | Malaviya ..................... 365/159 |
| 4,647,954 A | 3/1987 | Graf et al. ...................... 257/35 |
| 4,675,711 A | 6/1987 | Harder et al. .................. 257/27 |
| 4,835,581 A | 5/1989 | Kuroda et al. ............... 257/105 |
| 4,849,799 A | 7/1989 | Capasso et al. ................ 257/25 |
| 4,849,934 A | 7/1989 | Yokoyama et al. .......... 365/159 |
| 4,868,418 A | 9/1989 | Imamura et al. ............... 327/77 |
| 4,907,196 A | 3/1990 | Mori et al. ................... 365/159 |
| 4,999,697 A | 3/1991 | Capasso et al. ................ 257/15 |
| 5,234,848 A | 8/1993 | Seabaugh .................... 438/172 |
| 5,266,814 A | 11/1993 | Inata et al. .................... 257/25 |
| 5,280,182 A | 1/1994 | Waho ........................... 257/25 |
| 5,349,202 A | 9/1994 | Uemura ........................ 257/25 |
| 5,408,106 A | 4/1995 | Seabaugh ..................... 257/17 |
| 5,489,785 A | 2/1996 | Tehrani et al. ................. 257/23 |
| 5,512,764 A | 4/1996 | Seabaugh et al. ............. 257/25 |
| 5,514,876 A | 5/1996 | Schneier et al. .............. 257/25 |
| 5,543,749 A | 8/1996 | Awano ......................... 327/570 |
| 5,554,860 A | 9/1996 | Seabaugh ..................... 257/25 |
| 5,606,178 A | 2/1997 | Schulman et al. ............ 257/25 |
| 5,654,558 A | 8/1997 | Meyer et al. .................. 257/25 |
| 5,665,618 A | 9/1997 | Meyer et al. ................ 438/172 |
| 5,710,058 A | 1/1998 | Schneier ..................... 438/495 |
| 5,714,766 A * | 2/1998 | Chen et al. .................... 257/17 |
| 5,767,526 A | 6/1998 | Seabaugh ..................... 257/17 |
| 5,804,475 A | 9/1998 | Meyer et al. ................ 438/172 |
| 5,828,077 A | 10/1998 | Liu et al. ....................... 257/25 |
| 5,880,484 A | 3/1999 | Park et al. ..................... 257/25 |
| 6,080,996 A | 6/2000 | Yang ............................ 257/25 |
| 6,198,113 B1 | 3/2001 | Grupp ........................... 257/39 |
| 6,351,004 B1 | 2/2002 | Shimada et al. ............. 257/295 |
| 6,361,863 B1 * | 3/2002 | Gambino et al. ............ 428/402 |
| 6,573,526 B1 | 6/2003 | Yamashita et al. ............ 257/10 |
| 2002/0021158 A1 * | 2/2002 | Mullarkey ................... 327/277 |
| 2005/0130258 A1 * | 6/2005 | Trent et al. ................. 435/68.1 |

* cited by examiner

*Primary Examiner*—Long Pham
(74) *Attorney, Agent, or Firm*—Fletcher Yoder

(57) ABSTRACT

The disclosed embodiments relate to a vertical tunneling transistor that may include a channel disposed on a substrate. A quantum dot may be disposed so that an axis through the channel and the quantum dot is substantially perpendicular to the substrate. A gate may be disposed so that an axis through the channel, the quantum dot and the gate is substantially perpendicular to the substrate.

21 Claims, 4 Drawing Sheets

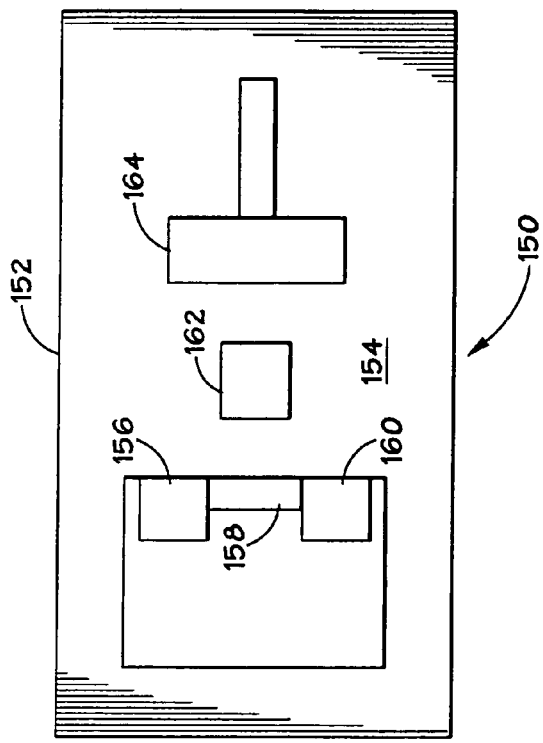
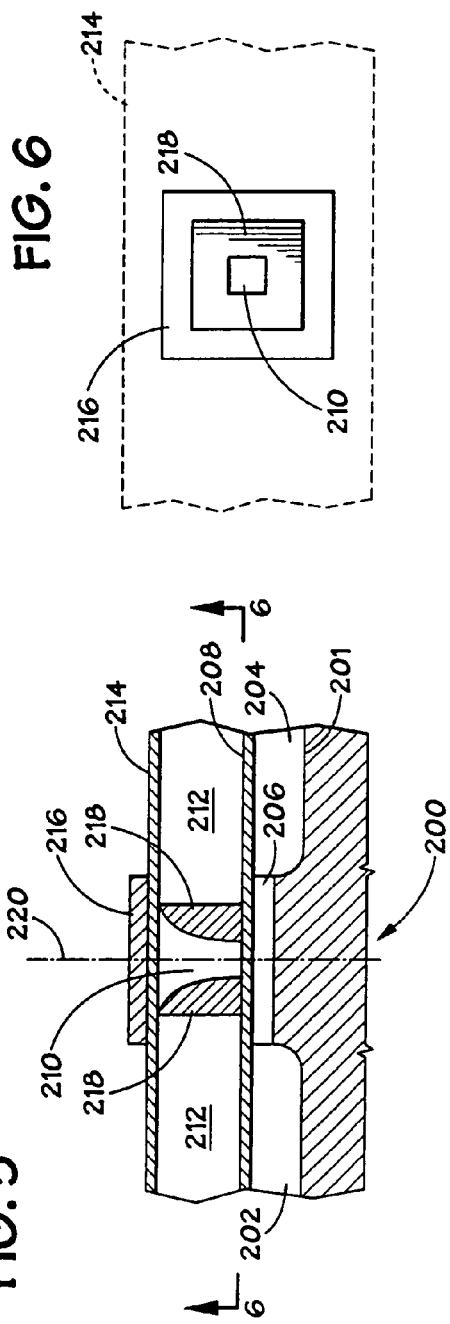

VERTICAL TUNNELING TRANSISTOR

BACKGROUND OF THE INVENTION

1. Field of the Invention

The present invention relates generally to the field of integrated circuit design and, more specifically, to providing a vertical tunneling transistor.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Computer systems and other electronic devices typically include a variety of electrically interconnected integrated circuit (IC) packages which perform a variety of functions, including memory and processing functions. An important development in semiconductor technology is a circuit element known as a tunneling transistor. The tunneling transistor is a high speed circuit element in which electrons "tunnel" across a seemingly impenetrable energy barrier based on principles of quantum mechanics. Tunneling transistors may have an increasingly important role in integrated circuit design because they have the potential of allowing development of integrated circuit devices that operate at speeds that are many times faster than typical transistors.

A tunneling transistor may include a small island of conductive material, which may be referred to as a "quantum dot," in addition to a gate, channel, source, and drain. To facilitate room temperature operation, the quantum dot may have dimensions on the order of 1–3 nanometers (nm). Tunneling transistors are typically laid out horizontally so that an axis running through the channel, quantum dot, and gate is parallel to the plane of the substrate on which the tunneling transistor is disposed. Such a horizontal arrangement may facilitate relatively easy alignment of the quantum dot with the channel of the transistor. Such a layout, however, does not lend itself to the benefits of emerging manufacturing technologies such as atomic layer deposition, which may be referred to as "ALD." ALD may be used to create very thin layers of somewhat precise thickness. The ability to closely control layer thickness does not yield significant benefit when producing horizontal tunneling transistors.

BRIEF DESCRIPTION OF THE DRAWINGS

Advantages of the invention may become apparent upon reading the following detailed description and upon reference to the drawings in which:

FIG. 4 is a diagram showing a horizontally disposed tunneling transistor;

FIG. 5 is a diagram showing a vertical tunneling transistor in accordance with an exemplary embodiment of the present invention;

FIG. 6 is a diagram taken along lines 6—6 in FIG. 5 showing a top view of a vertical tunneling transistor in accordance with an exemplary embodiment of the present invention.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
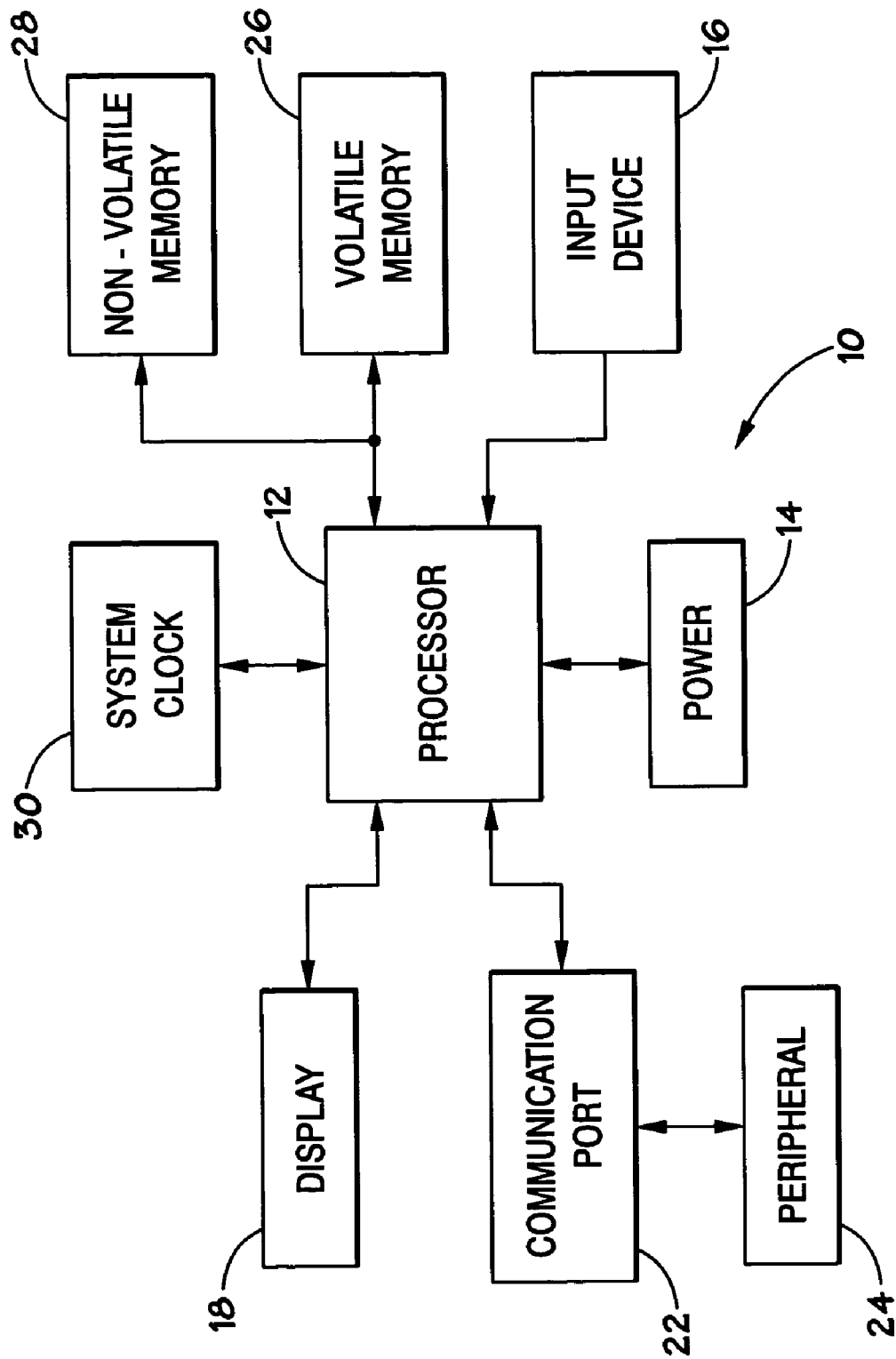
FIG. 1 is a block diagram of an electronic device containing integrated circuit devices that may employ embodiments of the present invention.

Turning now to the drawings, FIG. 1 is a block diagram depicting an exemplary processor-based electronic device, generally designated by the reference numeral 10. The device 10 may be any of a variety of different types, such as a computer, pager, cellular telephone, personal organizer, etc. In a typical processor-based device, a processor 12, such as a microprocessor, executes software to control the operation of the device 10.

The device 10 typically includes a power supply 14. If the device 10 is portable, the power supply 14 may include a fuel cell, permanent batteries, replaceable batteries, and/or rechargeable batteries. The power supply 14 may also include an AC adapter, so that the device may be powered from a wall outlet. The power supply 14 may also include a DC adapter, so that the device 10 may be plugged into a source of DC power such as the cigarette lighter receptacle in a vehicle.

Various other devices may be coupled to the processor 12, depending upon the functions that the device 10 performs. For instance, an input device 16 may be coupled to the processor 12. The input device 16 may include any type of device that allows a user to issue commands to the device 10. Examples of typical input devices include buttons, switches, a keyboard, a light pen, a mouse, and/or a voice recognition system. A display 18 may also be coupled to the processor 12. The display 18 may include an LCD display, a CRT, LEDs, and/or an audio display. A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory devices may be coupled to the processor 12 to store the programming and other data. For instance, the processor 12 may be coupled to volatile memory 26, which may include dynamic random access memory (DRAM), static random access memory (SRAM), etc. The processor 12 may also be coupled to non-volatile memory 28. The non-volatile memory 28 may include a read-only memory (ROM), such as an EPROM or flash memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

A system clock 30 may be connected to one or more of the components of the device 10. The connections between the system clock and other devices are not shown in FIG. 1 for purposes of clarity. Examples of components within the device 10 that may be connected to the system clock 30 include the processor 12, the non-volatile memory 28, and/or the volatile memory 26.

The processor 12, the non-volatile memory 28, and the volatile memory 26 may be implemented as one or more integrated circuit components. Also, the processor 12, the non-volatile memory 28, and the volatile memory 26 are examples of integrated circuit components that may include embodiments of tunneling transistors constructed according to the present invention.

Figure 2:
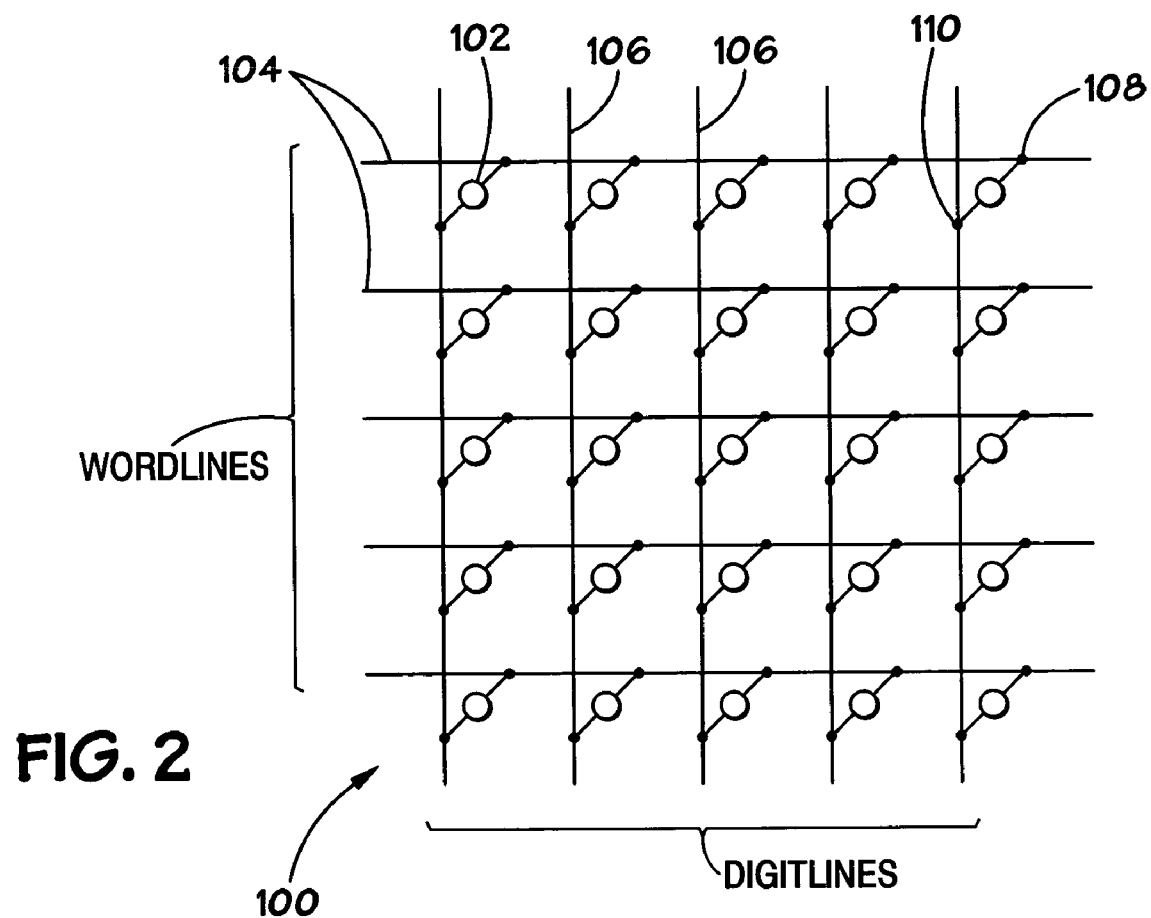
FIG. 2 illustrates a portion of a memory array.

FIG. 2 illustrates a portion of a memory array, which may be included in one or more of the integrated circuit devices illustrated as part of the electronic device 10 in FIG. 1. The memory array is referred to generally by the reference numeral 100. As can be seen, the memory array 100 includes a plurality of memory cells 102 that are arranged in generally perpendicular rows and columns. The memory cells 102 in each row are coupled together by a respective word line 104, and the memory cells 102 in each column are coupled together by a respective digit line or bit line 106. Specifically, each memory cell 102 includes a word line node 108 that is coupled to a respective word line 104, and each memory cell 102 includes a digit line node 110 that is coupled to a respective digit line 106. The conductive word lines 104 and digit lines 106 are collectively referred to as address lines. These address lines may be electrically coupled to an integrated circuit such as a processor or memory controller so that each of the memory cells 102 can be accessed for storage and retrieval of information.

Figure 3:
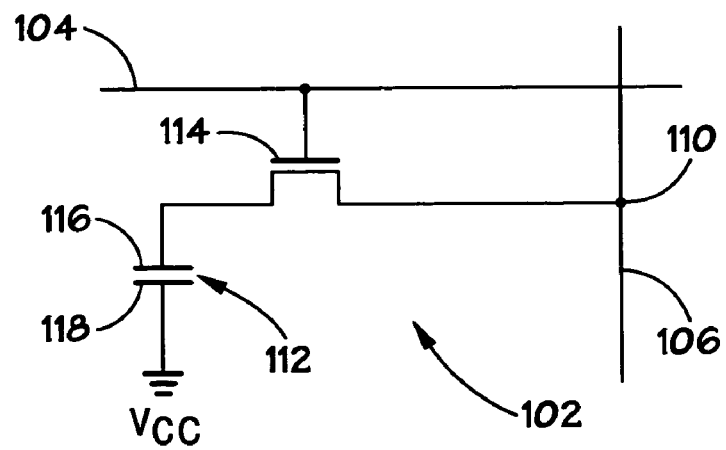
FIG. 3 illustrates an electric schematic diagram of an exemplary memory cell in the array of FIG. 2.

FIG. 3 illustrates an exemplary memory cell 102 that may be used in the memory matrix 100. The memory cell 102 includes a memory element 112 that may be coupled to an access device 114. The memory element 112 may be a capacitive memory element such as a storage capacitor, and the access device 114 may be a MOSFET transistor or other suitable type of access transistor. Capacitors may be used as the storage element in dynamic random access memory ("DRAM") or other memory types. The gate of the transistor 114 may be coupled to the word line 104 to form the word line node 108, and the source of the transistor 114 may be coupled to the bit line 106 to form the digit line node 110. One plate 116 of the memory element 112 may be coupled to the drain of the transistor 114, and the other plate 118 of the memory element 112 may be coupled to a voltage level $V_{cc}$, which is typically circuit ground.

FIG. 4 is a diagram showing a top view of a known horizontal tunneling transistor, which may be used as an access device such as the transistor 114 in FIG. 3. The horizontal tunneling transistor, which is generally referred to by the reference numeral 150, may be disposed on a substrate 152, which may be coated with an oxide layer 154. The horizontal tunneling transistor 150 may include a source 156, a channel 158, a drain 160, and a gate 164.

A quantum dot 162 may be disposed on the oxide layer 154 between the gate 164 and the channel 158. The quantum dot 162 may be constructed of conducting material. If the quantum dot 162 is sufficiently small, then the energy required to land an electron on it or to remove an electron from it depends on the size of the quantum dot 162 and the number of electrons that are already on the quantum dot 162. In a horizontal tunneling transistor such as the known tunneling transistor 150, an axis that runs through the channel 158, quantum dot 162, and gate 164 is parallel to the plane of the substrate 152. This configuration may make it easier to align the quantum dot 162 with the channel 158 during manufacture. Nonetheless, manufacturing processes such as atomic layer deposition ("ALD"), which allows relatively fine control of deposited layers in a vertical direction with respect to a substrate, does not offer significant benefits for the manufacture of the horizontally disposed tunneling transistor 150.

FIG. 5 is a cross-sectional view of a vertical tunneling transistor in accordance with an exemplary embodiment of the present invention. The vertical tunneling transistor is generally referred to by the reference numeral 200. The view shown in FIG. 5 is taken through an axis substantially perpendicular to a substrate on which the vertical tunneling transistor 200 is disposed. The manufacture of the vertical tunneling transistor 200 may utilize the deposition of very thin layers of material, using a suitable technique such as atomic layer deposition ("ALD"). ALD is a process that employs sequential, self-limiting surface reactions to produce very thin, controllable layers in the semiconductor manufacturing process. In ALD, chemical precursors are pulsed onto the surface of a wafer in a sequential manner, without mixing the precursors in a gaseous phase. In this manner, the individual precursors react with the surface on which they are being disposed to form a single layer at a time. ALD may be performed at lower temperatures than typical deposition processes.

The vertical tunneling transistor 200 may be disposed on a substrate 201. The substrate may comprise a semiconductor, insulator, dielectric or any other suitable substrate material. The vertical tunneling transistor 200 may comprise a source 202, a drain 204, and a channel 206. The source 202, drain 204, and the channel 206 may be comprised of materials typically used to form those components in known tunneling transistors. These materials may include doped silicon (Si) for the source 202 and the drain 204, and lightly doped silicon (Si) for the channel 206.

A tunneling barrier 208 may separate a quantum dot 210 from the channel 206. The tunneling barrier 208 may be comprised of silicon dioxide ($SiO_2$), $Si_3Na$, aluminum oxide ($Al_2O_3$), tantalum carbide ($Ta_2O_5$), hafnium oxide ($HfO_2$) or the like, and the quantum dot may be comprised of a conductive material such as semiconductors such as germanium (Ge), silicon (Si) or metals such as tungsten (W), tin (Sn), platinum (Pt), rhodium (Rh) or the like. Spacers 218 may be provided in accordance with known techniques to create the quantum dot 210 in such a manner that the quantum dot 210 may be of sub-lithographic size. Multiple spacers may be used to control the size of the quantum dot 210, if desired. The quantum dot 210 may be etched to reduce its thickness. Those of ordinary skill in the art will appreciate that other known self-alignment techniques may be employed to achieve one or more of the structures depicted in FIG. 5.

The quantum dot 210 may be flanked by a dielectric 212 such as borophosphosilicate glass, which may be referred to as BPSG. An insulative layer 214 may separate the quantum dot 210 from a gate 216. Full etch back or chemical-mechanical polishing ("CMP") may be used to place the quantum dot 210 next to the insulative layer 214. ALD may be used to dispose one or more layers of the vertical tunneling transistor 200, including the tunneling barrier 208 and/or the insulative layer 214, onto the substrate 201. The use of ALD allows relatively fine control over the thickness of layers deposited therewith. This fine control over layer thickness allows the effective buildup of vertical tunneling transistor structures.

As shown in FIG. 5, an axis 220 running through the channel 206, the quantum dot 210 and the gate 216 may be generally or substantially perpendicular to the plane of the substrate 201. The vertical orientation of the tunneling transistor 200 with respect to the substrate 201 may allow the thickness of the layers comprising the device features to determine the dimensions of the device. This is true because the relative thickness of the functional layers of the vertical tunneling transistor 200 may correspond to the relative horizontal dimensions and distances between components of a horizontal tunneling transistor such as the known horizontal tunneling transistor 150 illustrated in FIG. 4. The use of ALD to create one or more of the vertical layers of the vertical tunneling transistor 200 may provide a device with relatively small horizontal dimensions compared to known horizontal tunneling transistors.

FIG. 6 is a diagram taken along lines 6-6 in FIG. 5 showing a top view of a vertical tunneling transistor in accordance with an exemplary embodiment of the present invention. Those of ordinary skill in the art will appreciate that rectangular geometry of the spacer 218 and the quantum dot 210 shown in FIG. 6 is exemplary only. The geometries of the spacer 218 and the quantum dot 210 may assume a wide range of shapes, including circular, for example.

Figure 7:
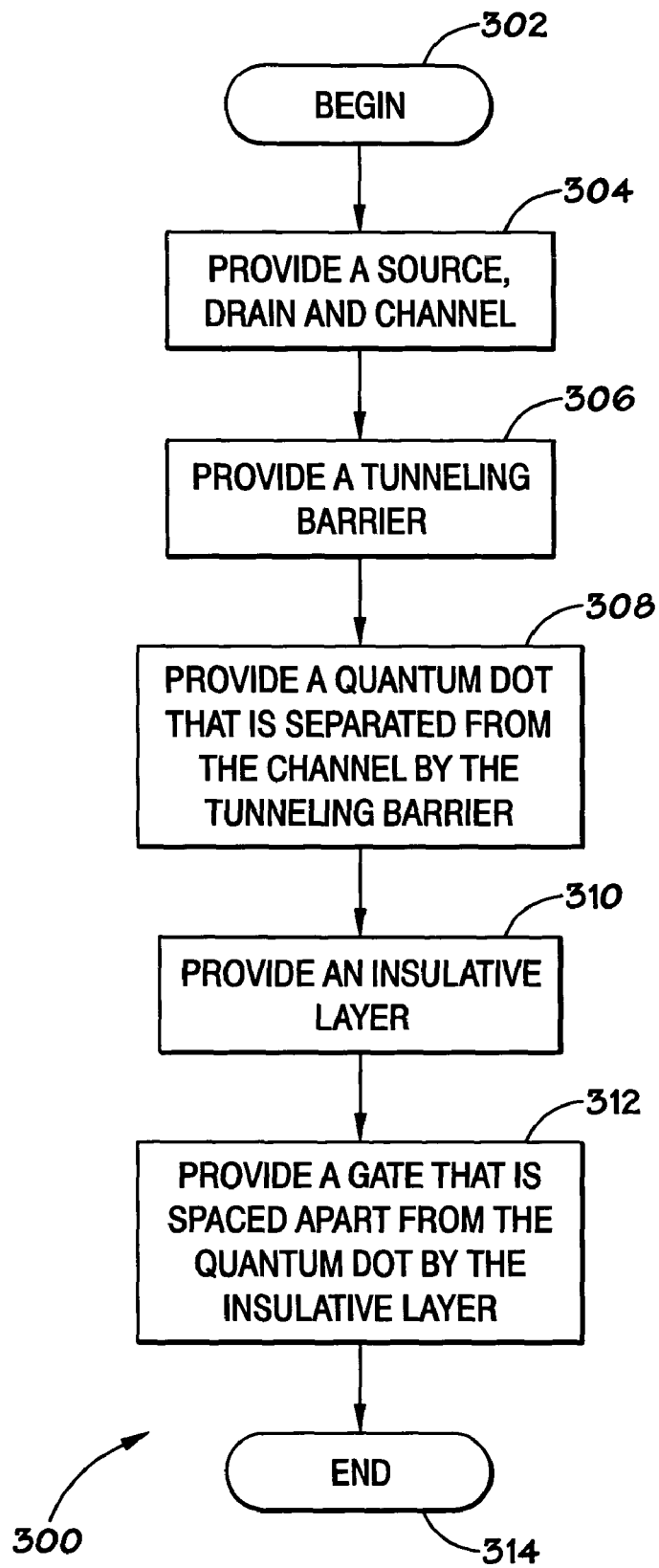
FIG. 7 is a flow diagram illustrating a method of providing a vertical tunneling transistor according to an exemplary embodiment of the present invention.

FIG. 7 is a flow diagram illustrating a method of providing a vertical tunneling transistor according to an exemplary embodiment of the present invention. The process is generally referred to by the reference numeral 300. At block 302, the process begins. At block 304, a source, drain, and channel, which may correspond to the vertically disposed source 202, drain 204, and channel 206 illustrated in FIG. 5, are provided. The source 202, drain 204 and channel 206 may be disposed on a substrate, such as the substrate 201 shown in FIG. 5. ALD may be used to dispose layers corresponding to the source 202, drain 204 and channel 206 on the substrate 201. At block 306, a tunneling barrier, such as the tunneling barrier 208 shown in FIG. 5, is provided. ALD may be used to provide the tunneling barrier 208. At block 308, a quantum dot such as the quantum dot 210 shown in FIG. 5 may be provided in such a manner that it is separated from the channel 206 by the tunneling barrier 208. ALD may be used to dispose the quantum dot 210 on the tunneling barrier 208.

At block 310, an insulative layer is provided. ALD may be used to dispose an insulative layer, such as the insulative layer 214 shown in FIG. 5, over the quantum dot 210. At block 312, a gate, such as the gate 216 shown in FIG. 5, is provided. The gate may be provided by ALD and may be spaced apart from the quantum dot 210 by the insulative layer 214. An axis through the channel 206, the quantum dot 210 and the gate 216, such as the axis 220 shown in FIG. 5, may be generally or substantially perpendicular to the plane of the substrate. At block 314, the process ends.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A device, comprising:
a memory element disposed on a substrate, and
an access device coupled to the memory element, the access device comprising:
a channel disposed on the substrate;
a quantum dot disposed so that the channel is between the quantum dot and the substrate, wherein the quantum dot is comprised of at least one of tungsten, tin, platinum, or rhodium;
a gate disposed so that the quantum dot is between the gate and the channel; and
wherein an axis through the channel, the quantum dot, and the gate is substantially perpendicular to an upper surface of the substrate.

2. The device set forth in claim 1, comprising a source disposed on the substrate adjacent to the channel.

3. The device set forth in claim 1, comprising a drain disposed on the substrate adjacent to the channel.

4. The device set forth in claim 1, comprising a tunneling barrier disposed between the channel and the quantum dot, wherein the tunneling barrier comprises at least one of tantalum carbide or hafnium oxide.

5. The device set forth in claim 1, comprising an insulative layer disposed between the quantum dot and the gate.

6. An integrated circuit device, comprising:
a substrate; and
a memory array that includes a plurality of memory cells disposed on the substrate, each of the plurality of memory cells comprising a memory element and an access transistor, the access transistor comprising:
a channel disposed on the substrate;
a self-aligned quantum dot disposed so that the channel is between the quantum dot and the substrate, wherein the quantum dot is comprised of at least one of tungsten, tin, platinum, or rhodium;
a gate disposed so that the quantum dot is between the gate and the channel; and
wherein an axis through the channel, the quantum dot, and the gate is substantially perpendicular to an upper surface of the substrate.

7. The integrated circuit device set forth in claim 6, comprising a source disposed on the substrate adjacent to the channel.

8. The integrated circuit device set forth in claim 6, comprising a drain disposed on the substrate adjacent to the channel.

9. The integrated circuit device set forth in claim 6, comprising a tunneling barrier disposed between the channel and the quantum dot, wherein the tunneling barrier comprises at least one of tantalum carbide or hafnium oxide.

10. The integrated circuit device set forth in claim 6, comprising an insulative layer disposed between the quantum dot and the gate.

11. A vertical tunneling transistor, the vertical tunneling transistor produced by the process of:
disposing a channel on a substrate;
disposing a dielectric layer on the substrate;
providing an aperture with a sidewall in the dielectric layer;

disposing a spacer adjacent the sidewall in the aperture that reduces a dimension of the aperture that is substantially parallel to the substrate to a sub-photolithographic size;

disposing a quantum dot within the aperture so that an axis through the channel and the quantum dot is substantially perpendicular to the substrate, wherein the quantum dot is comprised of at least one of tungsten, tin, platinum, or rhodium; and providing a gate so that an axis through the channel, the quantum dot and the gate is substantially perpendicular to the substrate.

12. The vertical tunneling transistor set forth in claim 11, wherein the process comprises employing atomic layer deposition to provide the channel.

13. The vertical tunneling transistor set forth in claim 11, wherein the process comprises employing atomic layer deposition to provide the quantum dot.

14. The vertical tunneling transistor set forth in claim 11, wherein the process comprises employing atomic layer deposition to provide the gate.

15. The vertical tunneling transistor set forth in claim 11, wherein the process comprises disposing a source adjacent to the channel.

16. The vertical tunneling transistor set forth in claim 11, wherein the process comprises disposing a drain adjacent to the channel.

17. The vertical tunneling transistor set forth in claim 11, wherein the process comprises providing a tunneling barrier, wherein the tunneling barrier comprises at least one of tantalum carbide or halfnium oxide.

18. The vertical tunneling transistor set forth in claim 11, wherein the process comprises employing atomic layer deposition to provide a tunneling barrier.

19. The vertical tunneling transistor set forth in claim 11, wherein the process comprises providing an insulative layer.

20. The vertical tunneling transistor set forth in claim 11, wherein the process comprises employing atomic layer deposition to provide an insulative layer.

21. The vertical tunneling transistor set forth in claim 11, wherein the process comprises coupling the vertical tunneling transistor to a memory element.

* * * * *